(12) United States Patent
Seo

(10) Patent No.: US 12,148,923 B2
(45) Date of Patent: Nov. 19, 2024

(54) METHOD FOR PREPARING SILICON BY USING GAS-PHASE ELECTROREDUCTION

(71) Applicant: BEILab corp., Ansan-si (KR)

(72) Inventor: Jihyun Seo, Suwon-si (KR)

(73) Assignee: BEILab corp., Ansan-si (KR)

( * ) Notice: Subject to any disclaimer, the term of this patent is extended or adjusted under 35 U.S.C. 154(b) by 0 days.

(21) Appl. No.: 18/558,536

(22) PCT Filed: May 30, 2022

(86) PCT No.: PCT/KR2022/007666
§ 371 (c)(1),
(2) Date: Nov. 2, 2023

(87) PCT Pub. No.: WO2022/255753
PCT Pub. Date: Dec. 8, 2022

(65) Prior Publication Data
US 2024/0243270 A1  Jul. 18, 2024

(30) Foreign Application Priority Data
May 31, 2021  (KR) .................. 10-2021-0070006

(51) Int. Cl.
| | | |
|---|---|---|
| *H01M 4/38* | (2006.01) | |
| *C01B 33/03* | (2006.01) | |
| *C23C 16/24* | (2006.01) | |
| *C23C 16/44* | (2006.01) | |
| *H01M 4/04* | (2006.01) | |

(Continued)

(52) U.S. Cl.
CPC ............. *H01M 4/386* (2013.01); *C01B 33/03* (2013.01); *C23C 16/24* (2013.01); *C23C 16/4414* (2013.01); *H01M 4/0428* (2013.01); *H01M 4/134* (2013.01); *H01M 4/1395* (2013.01); *H01M 4/362* (2013.01); *H01M 4/364* (2013.01); *H01M 10/0525* (2013.01);
(Continued)

(58) Field of Classification Search
CPC .... H01M 4/386; H01M 4/134; H01M 4/1395; H01M 4/0428; H01M 4/587; H01M 4/362; H01M 4/364; H01M 4/366; H01M 2004/8684; H01M 10/0525; C01B 33/03; C23C 16/24; C23C 16/4414
See application file for complete search history.

(56) References Cited

U.S. PATENT DOCUMENTS

2008/0261116 A1 * 10/2008 Burton ................. C23C 16/24
427/113
2010/0183818 A1 *  7/2010 Hwang ............. C23C 16/4401
427/475

(Continued)

FOREIGN PATENT DOCUMENTS

KR   10-2008-0099616 A    11/2008
KR   10-2012-0051883 A     5/2012
(Continued)

*Primary Examiner* — Jeremiah R Smith
(74) *Attorney, Agent, or Firm* — NKL Law; Jae Youn Kim

(57) ABSTRACT

The present invention relates to a method for preparing silicon by using gas-phase electroreduction and, more specifically, to a method in which a silicon-based compound is gas-phase supplied, without a liquid medium, onto the surface of a base metal having a potential applied thereto, and thus silicon is reduced and applied onto the surface of the base metal.

6 Claims, 1 Drawing Sheet

(51) Int. Cl.
 *H01M 4/134* (2010.01)
 *H01M 4/1395* (2010.01)
 *H01M 4/36* (2006.01)
 *H01M 10/0525* (2010.01)
 *H01M 4/02* (2006.01)
 *H01M 4/86* (2006.01)

(52) U.S. Cl.
 CPC ... *C01P 2006/40* (2013.01); *H01M 2004/027* (2013.01); *H01M 2004/8684* (2013.01)

(56) References Cited

U.S. PATENT DOCUMENTS

| | | | |
|---|---|---|---|
| 2010/0227443 A1 | 9/2010 | Lee et al. | |
| 2011/0159365 A1* | 6/2011 | Loveness | H01M 4/38 |
| | | | 29/623.1 |
| 2011/0165468 A1* | 7/2011 | Alias | H01M 4/364 |
| | | | 427/215 |
| 2013/0177820 A1* | 7/2013 | Kumta | C25D 3/665 |
| | | | 252/500 |
| 2014/0079997 A1* | 3/2014 | Rosso | H01M 4/1395 |
| | | | 429/213 |
| 2020/0020935 A1* | 1/2020 | Costantino | C01B 33/029 |
| 2021/0057755 A1* | 2/2021 | Brewer | H01M 4/48 |

FOREIGN PATENT DOCUMENTS

| KR | 10-2013-0141206 A | 12/2013 |
|---|---|---|
| KR | 10-2015-0118304 A | 10/2015 |
| KR | 10-1929413 B1 | 12/2018 |

\* cited by examiner

METHOD FOR PREPARING SILICON BY USING GAS-PHASE ELECTROREDUCTION

TECHNICAL FIELD

The present invention relates to a silicon preparation method using gas-phase electroreduction, and more particularly to a method of gas-phase supplying a silicon-based compound to the surface of a base material having an electric potential applied thereto without using a liquid medium to form a reduction coating of silicon on the surface of the base material.

BACKGROUND ART

A lithium secondary battery, which is a battery that is charged and discharged using redox reaction of lithium ions, includes a positive electrode and a negative electrode formed in the state in which an ion exchange membrane is interposed therebetween and an electrolytic solution.

In order to use the lithium secondary battery in a system that requires a higher-capacity battery, including an electric vehicle, there is a need to increase the capacity of a negative electrode active material and to improve output and lifespan characteristics.

A conventional carbon-based negative electrode active material has a theoretical capacity of only 372 mAh/g, and output characteristics thereof are significantly reduced particularly during high-speed charging due to the mechanism of interlayer insertion and removal of lithium ions into and from carbon during charging and discharging.

Accordingly, research to apply silicon, which has a lithium capacity as high as ten times those of carbon-based materials that are currently used, to the negative electrode of the lithium battery has been actively conducted.

However, the higher the silicon content, the lower the performance, such as volume expansion during charging and discharging and reduced lifespan.

Meanwhile, conventional technology for reducing chlorosilane molecules to silicon is to dissolve the molecules in a liquid medium, such as liquid electrolyte or molten metal salts, and to reduce molecules to silicon by electrochemical deposition; however, there is a problem in that precise coating control is difficult and application to a porous material is impossible.

PRIOR ART DOCUMENT

Korean Registered Patent No. 1929413

DISCLOSURE

Technical Problem

It is an object of the present invention to provide a silicon coating method that exhibits good precision and controllability on a porous material without using a liquid medium.

Technical Solution

In order to accomplish the above object, the present invention provides a silicon preparation method using gas-phase electroreduction, the silicon preparation method including:

applying an electrical potential to the surface of a base material;

gas-phase supplying a silicon-based compound to the base material having the electric potential applied thereto; and gas-phase reducing the silicon-based compound to form a silicon coating layer on the surface of the base material.

Advantageous Effects

According to the present invention, a silicon-based precursor compound is gas-phase supplied without using a liquid medium, such as liquid electrolyte or molten metal salts, whereby application to a porous material is possible and excellent precision may be exhibited.

In addition, a coating layer prepared according to a method according to the present invention is applicable to a silicon-based compound in a negative electrode active material of a lithium-ion battery, and high capacity characteristics are stably developed even when charging and discharging are repeated, whereby excellent lifespan characteristics and stability may be exhibited.

BEST MODE

Figure 1:
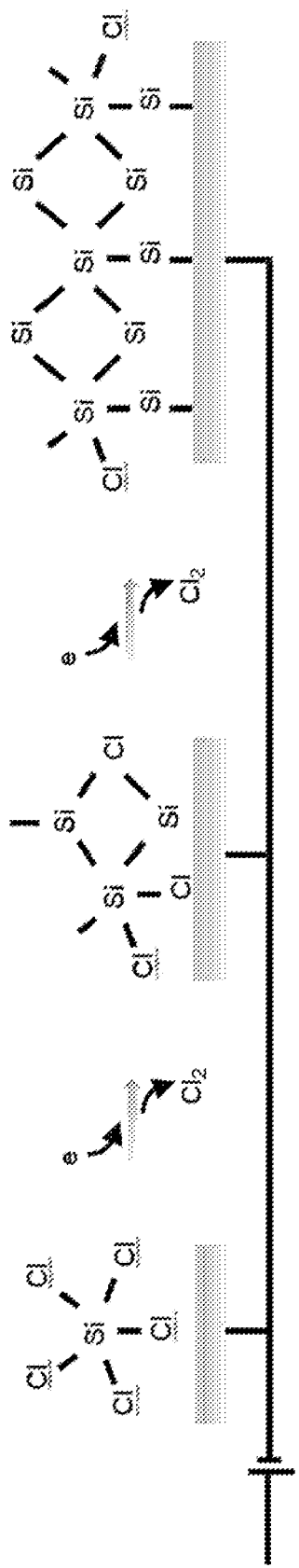
FIG. 1 is a chemical reaction view of a method according to the present invention.
Figure 2:
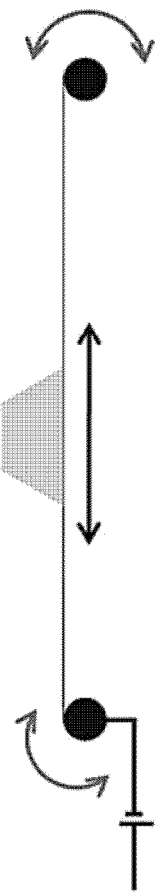
FIG. 2 is a view showing a process of gas-phase supplying a silicon-based precursor according to an embodiment of the present invention.

Hereinafter, the present invention will be described in more detail.

An embodiment of the present invention relates to a silicon preparation method using gas-phase electroreduction, the silicon preparation method including:

a step of applying an electric potential to the surface of a base material;

a step of gas-phase supplying a silicon-based compound to the base material having the electric potential applied thereto; and a step of gas-phase reducing the silicon-based compound to form a silicon coating layer on the surface of the base material.

In the method of the present invention, a coating of silicon is directly formed on the surface of the base material using an electrochemical or chemical method without using a liquid medium. Specifically, a silicon-based compound (silane) is gas-phase supplied to the surface of the base material having the electric potential applied thereto to form a reduction coating of silicon on the surface of the base material.

In the embodiment of the present invention, the gas-phase silicon-based precursor compound, specifically a chlorosilane compound, may be vaporized, and the silicon coating layer may be formed on the surface of the base material disposed in a reactor using a chemical deposition method (specifically, a chemical field deposition method).

The process of forming the silicon coating layer on the surface of the base material is preferably carried out at a temperature range of room temperature to 500° ° C. (i.e. the temperature range of the reactor) for 0.1 to 5 hours while the gas-phase silicon-based precursor compound is continuously supplied into the reactor. Preferably, the temperature range of the reactor (i.e. the temperature range in the reactor) may be 150° C. to 250° C., in which case degradation of the base material may be minimized or inhibited. In the reactor, gas, such as hydrogen (H$_2$), argon (Ar), or nitrogen (N$_2$), may flow at a constant flow rate.

In the embodiment of the invention, the silicon-based compound may be supplied using a separate stainless steel precursor storage vessel, and the storage vessel may be heated to a temperature range of room temperature to 350° C. in order to vaporize the silicon-based compound.

In one embodiment of the invention, the chlorosilane compound may be supplied in a gaseous state without being dissolved in a liquid medium, and may be continuously or pulse-like supplied without using a catalyst or a reducing agent.

In the embodiment of the present invention, the silicon coating layer may be constituted by a plurality of silicon nanoparticles dispersed in the form of islands, films, or a combination thereof.

Specifically, when gas-phase electroreduction is used, the silicon coating layer starts to be formed in the form of islands, and the islands are formed only in voids in the preformed negative electrode active material, whereby the islands are suitable for response to the volume expansion of the silicon nanoparticles contained in the silicon coating layer.

As the deposition amount increases, however, the silicon coating layer is formed in the form of films, and finally the silicon coating layer is formed in the state in which the films and the islands are mixed with each other. In this case, the capacity per weight of the silicon particles may be improved, and formation efficiency may be improved.

In contrast, when a physical preparation method such as ball milling is used, it is nearly impossible to control distribution of the silicon nanoparticles so as to be uniform and to achieve attachment without electrical resistance.

The silicon nanoparticles formed in the carbon-based negative electrode active material by gas-phase electroreduction are already electrically bonded with the carbon-based material at the interface therebetween, whereby irreversible capacity loss is minimized. In contrast, for an electrode made of a mixture of pre-synthesized silicon nanoparticles and carbon-based negative electrode active material, the surface of each of the silicon nanoparticles is exposed, which acts as a source of irreversible capacity loss.

The silicon nanoparticles formed by gas-phase electroreduction may be spherical particles having a diameter of 5 to 100 μm, and may be amorphous. In addition, carbon, oxygen, or nitrogen in the precursor may participate in reduction of the silicon-based compound, whereby it is possible to synthesize not only pure silicon nanoparticles but also nanoparticles of a silicon-based compound. The amorphous silicon nanoparticles have a large capacity per weight of the particles, and the stress due to volume expansion during charging (i.e. alloying with lithium) is significantly less than in crystalline silicon nanoparticles, and the rate of alloying with and dealloying from lithium is fast, which is advantageous for charge and discharge rates.

In the embodiment of the present invention, the silicone coating layer may have a thickness of 5 to 100 μm.

In the embodiment of the invention, a hydrochlorosilane compound, such as silicon tetrachloride (SiCl$_4$), hexachlorodisilane (Si$_2$Cl$_6$), or dichlorosilane (SiH$_2$Cl$_2$), a methylchlorosilane compound, such as methylsilane (CH$_3$SiH$_3$), tetrakis(trichlorosilyl)silane, or silicon tetrafluoride (SiF$_4$) may be used as the silicon-based compound; however, the present invention is not limited thereto.

In the embodiment of the present invention, it is preferable to use the chlorosilane compound, which is one of the silicon-based compounds.

In the embodiment of the present invention, current or voltage may continuously or pulse-like supplied to the base material to apply an electric potential to the surface of the base material, whereby electrons may be supplied thereto. The applied electric potential may be applied to the base material in the form of direct current, alternating current, and an artificially created pulse.

A conductor, such as graphite, copper, lithium, aluminum, stainless steel, or a battery material (NMC/NCA/LFP), may be used as the base material; however, the present invention is not limited thereto. Depending on the type of base material, the electric potential may be applied in the form of a constant current or a constant voltage, and the current density per unit area may be 1 to 200 mA/cm$^2$; however, the present invention is not limited thereto. The voltage applied to the base material may generally be 1 to 100 V depending on the type of the chlorosilane compound; however, the present invention is not limited thereto.

The present invention relates to a lithium-ion/metal battery including a positive electrode, a negative electrode, and an electrolyte, wherein the negative electrode includes a silicon coating thin film prepared by the method described above.

According to the present invention, high capacity characteristics may be stably developed even when charging and discharging are repeated as the result of including the silicon coating, whereby it is possible to manufacture a lithium-ion/metal battery having excellent lifespan characteristics and stability.

Although the specific details of the present invention have been described in detail, a person having ordinary skill in the art to which the present invention pertains will appreciate that the detailed description thereof discloses only preferred embodiments of the present invention and thus does not limit the scope of the present invention. It will be possible for a person having ordinary skill in the art to which the present invention pertains to make various applications and modifications within the scope of the invention based on the above description.

Accordingly, the substantial scope of the present invention is defined by the appended claims and equivalents thereto.

The invention claimed is:

1. A silicon preparation method using gas-phase electroreduction, the silicon preparation method comprising:
    inserting a base material including a carbon-based negative electrode active material comprising voids into a reactor;
    applying an electrical potential to a surface of the base material located in the reactor;
    gas-phase supplying a silicon-based compound to the base material having the electric potential applied thereto so that electrons are supplied to the silicon-based compound on the surface of the base material in the reactor; and
    forming a silicon coating layer having a thickness in a range of 5 to 100 μm and comprising a plurality of spherical nanoparticles having a diameter in a range of 5 to 100 μm in the form of films or one or more islands on the surface of the base material by using the electrons to reduce the gas-phase silicon-based compound on the surface of the base material and to electrically bond the spherical nanoparticles with the carbon-based material at an interface therebetween to prevent irreversible capacity loss;
    wherein the silicon coating layer is formed in a state in which the films and the islands filling the voids are mixed with each other to control distribution of the plurality of nanoparticles so as to be uniform and to achieve attachment to the base material without electrical resistance.

2. The silicon preparation method according to claim 1, wherein the silicon-based compound is silicon tetrachloride ($SiCl_4$), hexachlorodisilane ($Si_2Cl_6$), dichlorosilane ($SiH_2Cl_2$), methylsilane ($CH_3SiH_3$), tetrakis(trichlorosilyl)silane, or silicon tetrafluoride ($SiF_4$).

3. The silicon preparation method according to claim 1, wherein the base material is graphite, copper, lithium, aluminum, stainless steel, or a battery material of NMC/NCA.

4. A lithium-ion/metal battery comprising:
a positive electrode; a negative electrode; and an electrolyte,
wherein the negative electrode comprises the silicon coating layer prepared by the method according to claim 1.

5. A lithium-ion/metal battery comprising:
a positive electrode; a negative electrode; and an electrolyte,
wherein the negative electrode comprises the silicon coating layer prepared by the method according to claim 2.

6. A lithium-ion/metal battery comprising:
a positive electrode;
a negative electrode; and
an electrolyte,
wherein the negative electrode comprises the silicon coating layer prepared by the method according to claim 3.

* * * * *